United States Patent
Wipiejewski (10) Patent No.: US 7,309,854 B2
(45) Date of Patent: Dec. 18, 2007

(54) PHOTO-DETECTORS AND OPTICAL DEVICES INCORPORATING SAME

(75) Inventor: Torsten Wipiejewski, Hong Kong SAR (CN)

(73) Assignee: Hong Kong Applied Science and Technology Research Institute Co. Ltd., Hong Kong Sar (CN)

( * ) Notice: Subject to any disclaimer, the term of this patent is extended or adjusted under 35 U.S.C. 154(b) by 140 days.

(21) Appl. No.: 11/246,117

(22) Filed: Oct. 11, 2005

(65) Prior Publication Data

US 2007/0080284 A1    Apr. 12, 2007

(51) Int. Cl.
*H01L 31/00* (2006.01)

(52) U.S. Cl. ..................... 250/214.1; 257/457

(58) Field of Classification Search ............. 250/214.1, 250/214 R, 206.1, 208.2, 208.6; 356/141.1, 356/141.3; 257/431, 440, 457, 465
See application file for complete search history.

(56) References Cited

U.S. PATENT DOCUMENTS

| | | | |
|---|---|---|---|
| 4,907,874 A | * | 3/1990 | Ake .......................... 356/4.08 |
| 5,451,769 A | * | 9/1995 | McAdoo et al. ......... 250/214.1 |

\* cited by examiner

*Primary Examiner*—Kevin Pyo
(74) *Attorney, Agent, or Firm*—Buchanan Ingersoll & Rooney PC (57) ABSTRACT

An opto-electronic device comprising a plurality of photo-detectors, each said photo-detector comprises a plurality of optical detection segments which are connected in parallel, the optical detection segments of said plurality of optical-detectors are interposed so that an optical detection segment of a photo-detector is intermediate optical detection segments of another photo-detector and an optical detection segment of that another photo-detector is intermediate optical detection segments of said photo-detector.

18 Claims, 10 Drawing Sheets

PHOTO-DETECTORS AND OPTICAL DEVICES INCORPORATING SAME

FIELD OF THE INVENTION

This invention relates to optical devices and, more particularly, to optical detectors. More specifically, although not exclusively, this invention relates to metal-semiconductor-metal (MSM) photo-detectors and opto-electronic devices incorporating same.

BACKGROUND OF THE INVENTION

Photo-detectors are essential for many optoelectronic applications, for example, optical communication, sensing, monitoring and/or control. Photo-detectors convert optical signals into electrical signals. The electrical signals are typically in the form of electrical current which is amplified before processing for information extraction. A typical photo-detector comprises a photo-sensitive area on which incoming optical signals impinge and where conversion of optical energy into electrical energy takes place. The photo-sensitive area is normally larger than the spatial spread of an incoming light beam in order to achieve maximum responsivity. In many applications, a plurality of photo-detectors or arrays of photo-detectors are required. For example, arrays of photo-detectors are required in spectrometers.

Figure 1:
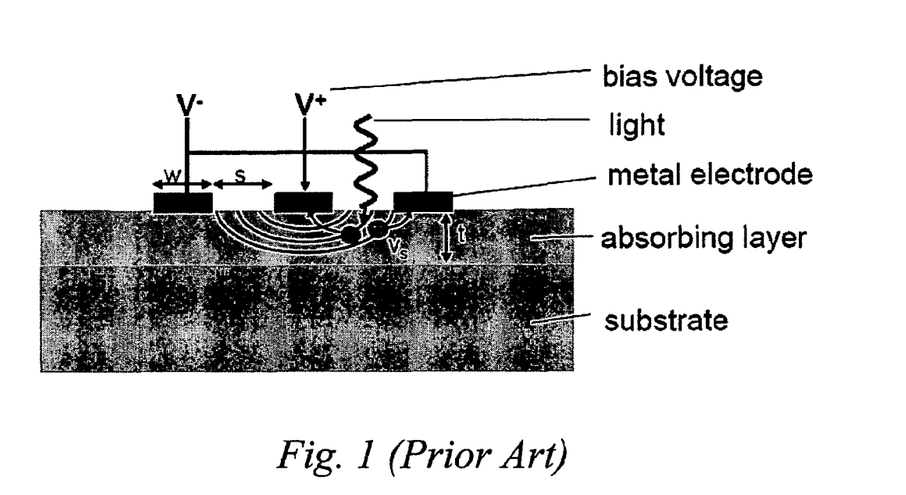
FIG. 1 is a schematic diagram showing a cross-section of a conventional MSM photo-detector.

Metal-semiconductor-metal (MSM) photo-detectors have been widely used for light detection in fibre-optic systems for many years because of their high speed and high sensitivity. A typical MSM photo-detector as shown in FIG. 1 comprises an absorbing layer of an appropriate thickness on a substrate with metal electrodes deposited on the absorbing layer. An exemplary MSM photo-detector for application in the 850 nm wave length range or lower comprises an absorbing layer of un-doped GaAs and a semi-insulating GaAs substrate. An example of MSM photo-detector is described in U.S. Pat. No. 5,461,246 which is incorporated herein by reference.

OBJECT OF THE INVENTION

It is an object of this invention to provide novel optical detection devices comprising a plurality of photo-detectors in a novel configuration. At a minimum, it is an object of this invention to provide a useful alternative of a optical-detecting device comprising a plurality of photo-detectors, for choice of the public.

SUMMARY OF THE INVENTION

Broadly speaking, the present invention has described an opto-electronic device comprising a plurality of photo-detectors, each said photo-detector comprises a plurality of optical detection segments which are connected in parallel, the optical detection segments of said plurality of optical-detectors are interposed so that an optical detection segment of a photo-detector is intermediate optical detection segments of another photo-detector and an optical detection segment of that another photo-detector is intermediate optical detection segments of said photo-detector. This structure is advantageous for many optical sensing or other applications.

Preferably, each said optical detection segment is elongated and comprises a plurality of interposed metal electrodes on an optical absorption layer.

Preferably, said elongated optical detection segments are of the same width and the spacing between an adjacent pair of interposed elongated optical detection segments is the same. This provides the advantages that precise light spot tracking can be performed using a relating simple device.

Preferably, said elongated optical detection segments are of the same dimensions and the spacing between an adjacent pair of interposed elongated optical detection segments is the same.

Preferably, said elongated optical detection segments comprise rectangular portions of the same width, the long sides of said elongated optical segments are parallel and the spacing between an adjacent pair of interposed elongated optical detection segments is the same.

Preferably, said optical detection segments is elongated and the length to width ratio of said elongated photo-detection segment exceeds 10.

Preferably, said optical detection segments is elongated and the length to width ratio of said elongated photo-detection segment exceeds 100.

Preferably, said plurality of photo-detectors are formed on a single substrate. This is advantageous because a robust and precise sensing device can be available at low costs and readily deployable.

Preferably, each of said plurality of photo-detectors has individual output terminals.

Preferably, said photo-detector comprises a photo-diode.

Preferably, said photo-detector comprises a MSM photo-detector the unique voltage-current characteristics of a MSM photo-detector makes it possible to generate photo-current of opposite polarity due to same light by varying biasing-voltage and this provides remarkable utility.

Preferably, said device further comprising differential circuitry in differential connection with signal outputs of said plurality of photo-detectors.

Preferably, the elongated photo-detection segments of at least a photo-detector have a wave-length sensitive coating.

Preferably, the elongated photo-detection segments of a wavelength sensitive coating.

Preferably, the elongated photo-detection segments of a photo-detector have a wavelength sensitive coating and the wavelength sensitivity of the coating on said plurality of photo-detectors is different.

Preferably, said device further comprising wave-length sensing circuitry, the wave-length sensing circuitry comprises signal processing means to process differential signal outputs from said plurality of photo-detectors for determining the wave-length of an incoming optical signal.

According to a preferred embodiment of the present invention, there is provided an optical detection device comprising an opto-electronic device of this invention, wherein said plurality of photo-detectors are with differential outputs, the differential outputs are differentially amplified.

Preferably, said plurality of photo-detectors are coated with wavelength sensitive substances and the wavelength sensitivity is different for said plurality of photo-detectors, difference of outputs from said plurality of photo-detectors are processed for wavelength identification.

BRIEF DESCRIPTION OF THE DRAWINGS

Preferred embodiments of the present invention will be explained in further detail below by way of examples and with reference to the accompanying drawings, in which.

DETAILED DESCRIPTION OF THE PREFERRED EMBODIMENTS

Figure 1A:
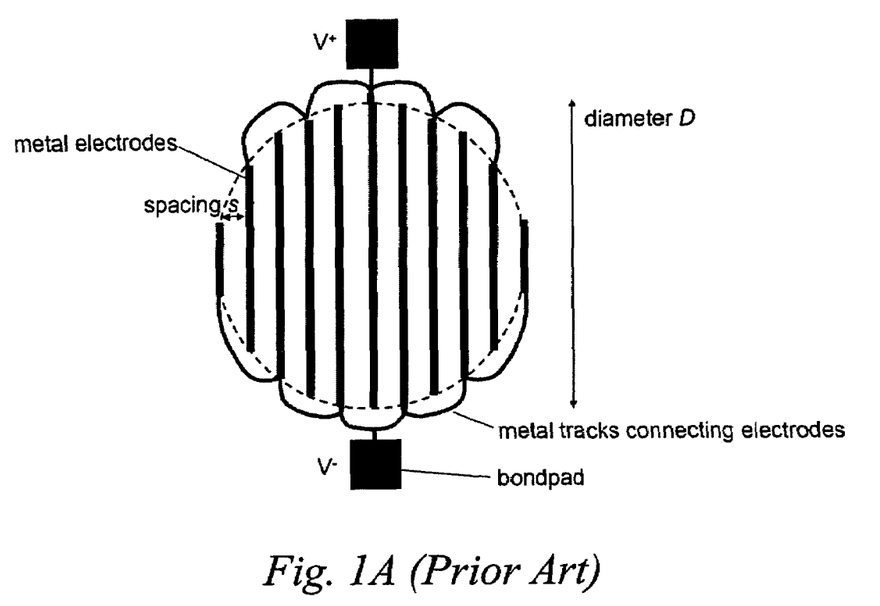
FIG. 1A is a schematic diagram showing metal electrodes of another conventional MSM photo-detector.

In a conventional single cell MSM photo-detector shown FIG. 1 comprising a single optical detection segment, metal electrode fingers are deposited on an active absorbing layer of an un-doped III-V semiconductor such as Gallium Arsenide (GaAs) or Indium Gallium Arsenide (InGaAs) to form an optical detection cell. The metal electrode fingers are configured in an interdigitated manner so that a metal electrode finger for connection to a first voltage bias ($V^+$ in FIG. 1) is intermediate a pair of metal electrode fingers for connection to a second voltage bias ($V^-$ in FIG. 1). In another conventional single cell MSM photo-detector as shown in FIG. 1A, the optical detection segment comprises a plurality of metal electrode fingers pairs which are deposited on an active absorbing layer of a III-V semiconductor to form a distributed optical detection segment. A plurality of metal electrode fingers are connected to each bias voltage and the plurality of metal electrode fingers are in an interdigitated configuration so that the optical detection segment comprises a plurality of adjacent parallel pairs of counterpart metal electrode fingers which are connected to the different bias voltages.

Due to the symmetric structure of a MSM photo-detector, the I-V characteristics of an ideal MSM photo-detector has positive/negative symmetry with respect to bias voltage, as shown in FIG. 2 of U.S. Pat. No. 5,461,246. When light of an appropriate wavelength impinges on the MSM device, the direction of photo-current depends on the polarity of the voltage bias. Thus, the direction of photo-current will be reversed if the polarity of the bias voltage is reversed.

Figure 2:
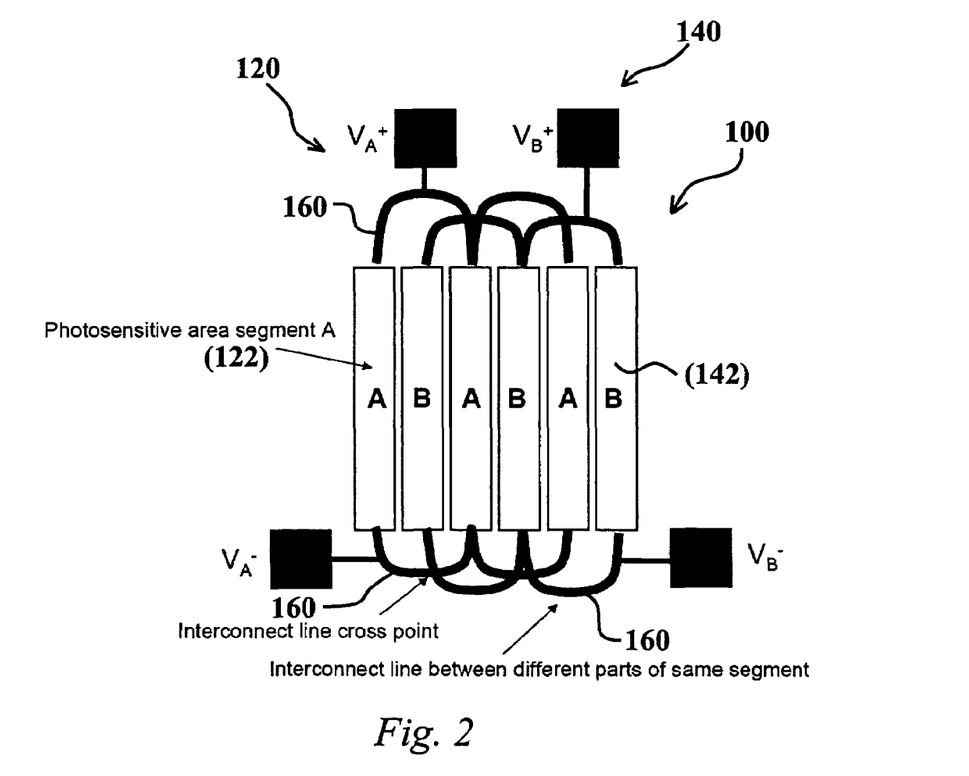
FIG. 2 is a schematic diagram showing an exemplary top view of an optical-detecting device of a first preferred embodiment of this invention.
Figure 3:
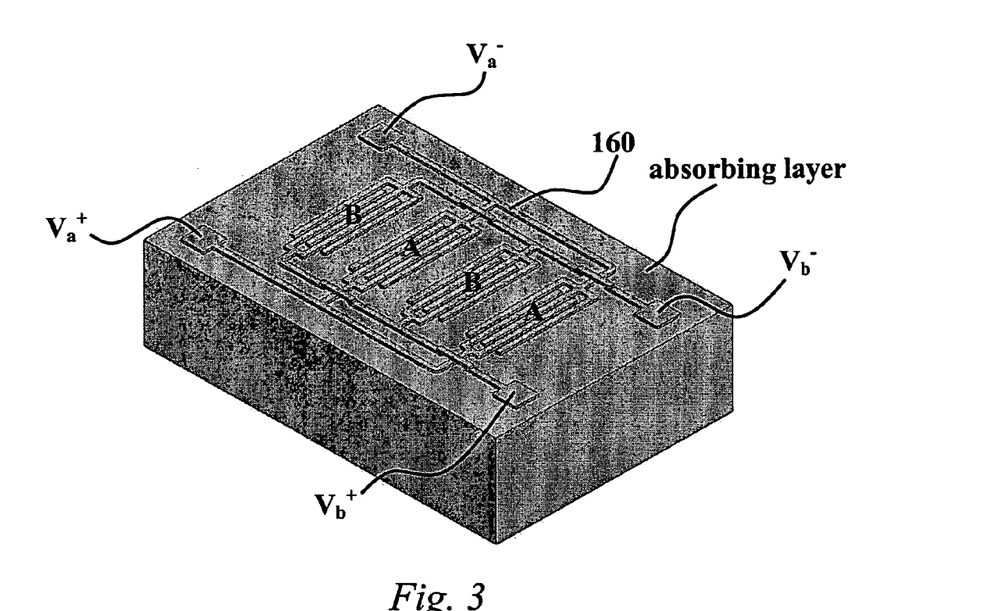
FIG. 3 is a top perspective view showing an exemplary implementation of the optical-detecting device of FIG. 2.

The optoelectronic device (100) of FIGS. 2 and 3 of this invention comprises a first photo-detector (120) and a second photo-detector (140). Each of the photo-detectors comprises a plurality of elongated optical detection segments (A122), (B142) which are in parallel electrical connection. A photo-detection segment of this device (100) is equivalent to a single optical detection cell of a conventional MSM detector and comprises a plurality of interposed metal electrodes described above. The elongated optical detection segments of a photo-detector are parallel to each other and the elongated optical detection segments of the two photo-detectors (120), (140) are interposed wherein an elongated optical detection segment of the first photo-detector is intermediate and parallel to a pair of elongated optical detection segments of the second photo-detector and vice versa. This interposed configuration between the elongated optical detection segments of the two photo-detectors are shown in FIG. 2 in A-B-A or B-A-B sequence in which A and B respectively represent an elongated optical detection segment of the first and the second photo-detectors. Hence, a set of two photo-detection segments (A, B) belonging respectively to the two photo-detectors are alternately disposed on the entire effective photo-sensitive region. The plurality of elongated optical segments of a photo-detector is interconnected, for example, by conductive wiring layout on the substrates. An insulation layer, for example, Silicon Nitride ($Si_3N_4$), may provide necessary insulation when the interconnection between segments A & B crosses.

Figure 2A:
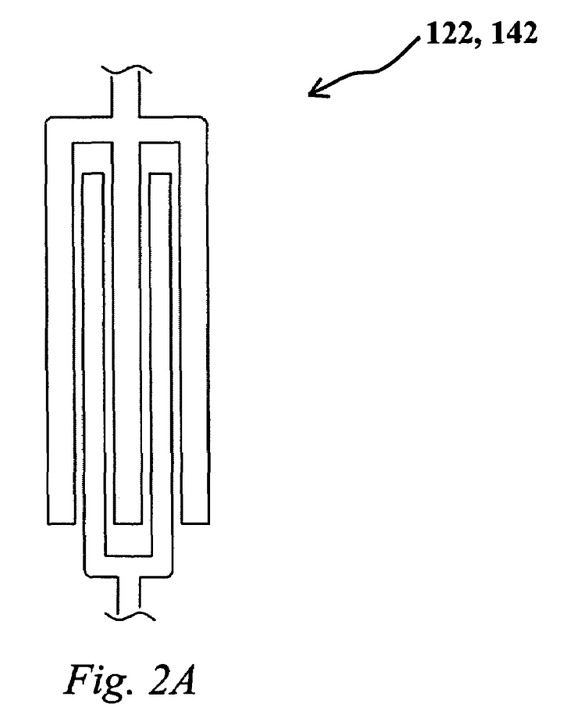
FIG. 2A is an enlarged view of a photo-detection segment.

Each of the photo-detection segment (A (122), B(142)) has a segment width (SW) and a segment length (SL) which defines the photosensitive area of a photo-detection segment. An adjacent pair of photo-detection segments is separated with an inter-segment spacing (SS). The segment widths (SW) of the photo-detection segments are identical with same inter-segment spacing between adjacent photo-detection segments. The photo-detection segment is elongated with an aspect ratio (SUSW) preferably exceeding 10, although an aspect ratio exceeding 100 will be beneficial for many applications employing this invention. For the sake of clarity, aspect ratio in this specification is the ratio between the segment length to the segment width.

Photo-detection segments of this device 100 have identical segment width and the segment spacing between adjacent pairs of photo-detection segments is also the same. With photo-detection segments A, B of an equal segment width and with an equal segment spacing between adjacent pairs of photo-detection segments, which belong to the two different photo-detectors, the effective photo-sensitive areas of each of the component photo-detectors on the entire photo-sensitive area is equal and substantially evenly distributed along a lateral or transversal direction in an interposed manner. With this even distribution of photosensitive segments (belonging to different photo-detectors) laterally across the entire photosensitive region, which comprises the entirety of the two photo-detectors, a light source with a lateral footprint exceeding the total aggregated lateral spread of a pair of photo-detection segments will be detected by both photo-detectors irrespective of the instantaneous locality of light impingement.

If the lateral footprint of an incoming light significantly exceeds the total lateral spread of a pair of adjacent photo-detection segments of the different photo-detectors, for example, if the lateral footprint exceeds the lateral spread of a plurality of photo-segment pairs, the photo-current output from each photo-detector will be more even. This evenness in optical detection reduces the sensitivity of optical response of a photo-detector due to the exact locality of light impingement. Consequently, optical alignment requirements between an optical source and an photo-detector can be less stringent. The formation of a plurality of photo-detectors with evenly distributed photo-detection segments which are mutually interposed facilitates splitting of an incoming light source into two photo-outputs without the need of a beam splitter. Furthermore, the polarity or direction of photo-current outputs from the plurality of photo-detectors can be varied by varying the polarity of voltage bias and this provides outstanding advantages.

The photo-current output evenness will be enhanced if the footprint of an incoming light source is laterally symmetrical. To further enhance photo-current output evenness, the photo-segments are symmetrical about a longitudinal axis which divides the photo-detection segments into two-halves laterally. As a convenient example, the photo-sensitive region of each photo-detection segment A or B is rectangular.

Although the photo-detection segments of each of the photo-detectors have identical segment width and with identical segment spacing between an adjacent pair of photo-detectors of different photo-detectors, it will be appreciated that segment widths and segment spacing can be varied according to specific applications, for example, for applications in which the locality of an incoming optical signal impingement on a photo-sensitive area needs to be discriminated. The variation of segment widths and spacing can be configured according to a pattern which will reflect on the locality of light reception on the photo-sensitive area.

Figure 4:
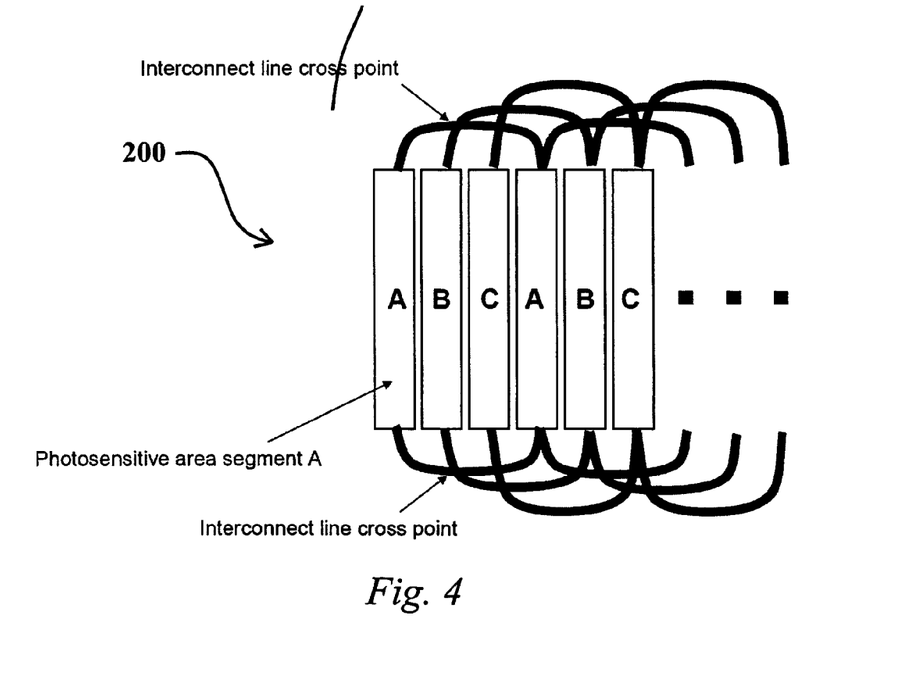
FIG. 4 is a schematic diagram showing an exemplary top view of an optical-detecting device of a second preferred embodiment of this invention.

The optoelectronic device 200 of FIG. 4 is similar to the device 100 of FIGS. 2 and 3 except that it comprises three photo-detectors instead of two. Each of the photo-detectors comprises a plurality of elongated optical detection segments (A, B or C) which are in parallel electrical connection. A set of three photo-detection segments (A, B, C) belonging respectively to the three photo-detectors are alternately disposed on the entire effective photo-sensitive region. The physical characteristics of each of the elongated optical detection segments and the inter-segment relationships are similar to the device (100) of FIGS. 2 and 3, although the elongated optical detection segments are arranged in the sequence ABCA, BCAB or CABC. Features of the device 100 described above apply mutatis mutandis to the device (200).

Figure 5:
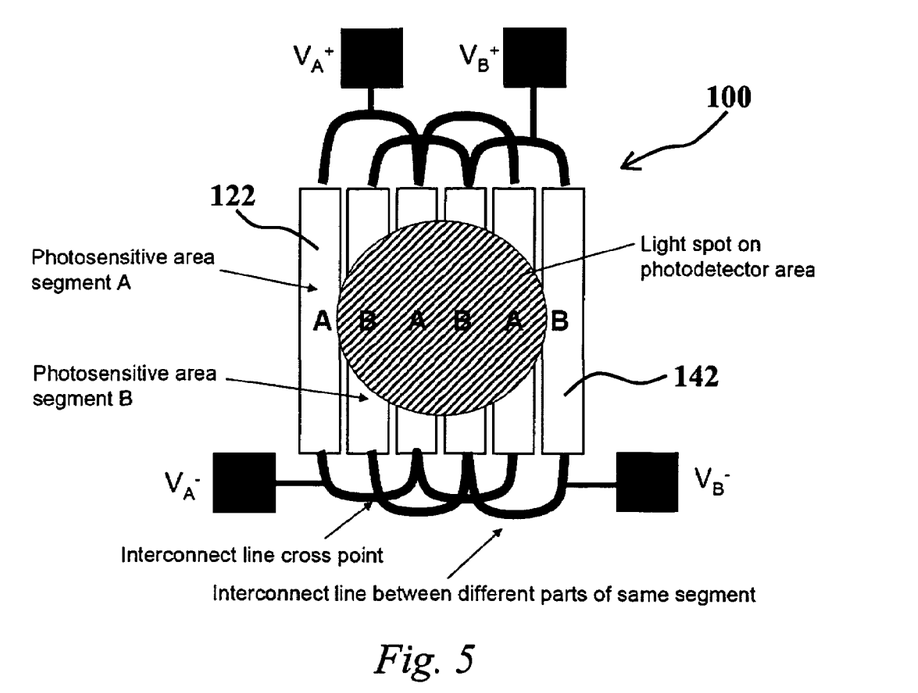
FIG. 5 is a schematic diagram showing a first application of the photo-detector of FIG. 2.
Figure 6:
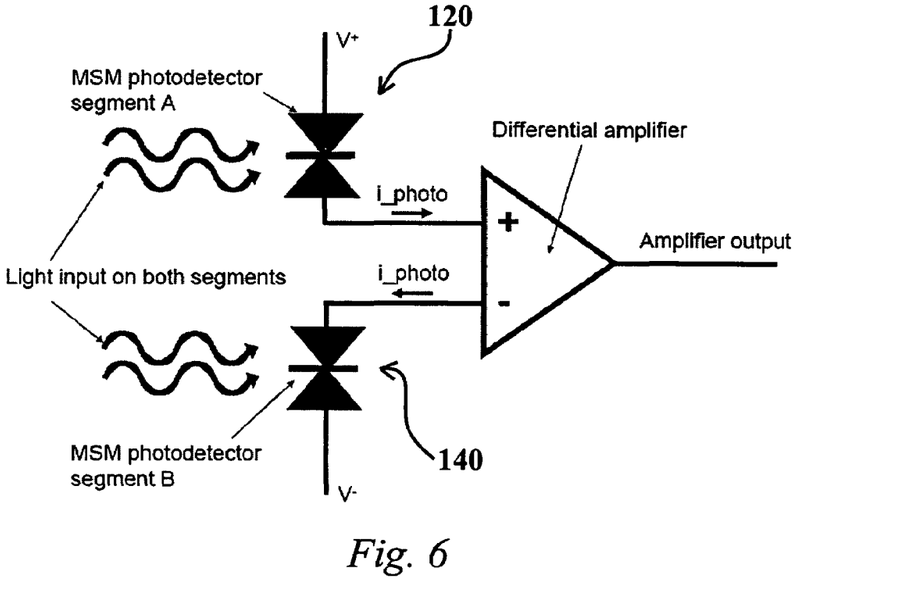
FIG. 6 is a schematic electrical diagram showing an operation of the application of FIG. 5.

FIGS. 5 and 6 illustrate a first exemplary application of the opto-electronic device of FIG. 2 in which differential electric output signals from the first and the second photo-detectors are utilized and processed. The first and the second photo-detectors are biased with opposite polarity of bias voltage so that the directions of output photo-current are opposite. The differential output signals resulting from the opposite current polarity are differentially amplified by, for example, a differential amplifier, for enhanced signal resolution. The physical dimensions of the photo-detection segments and their separation spacing are adapted so that the photo-current output of each of the photo-detectors is substantially identical irrespective of the instantaneous locality of the impingement of a light spot on the photo-sensitive area of the device. The features of distributed and interposed photo-detection segments, especially when the segment width and segment separation spacing are substantially smaller than the lateral extent of the light spot, enhances the uniformity of photo-current output from the device. The possibility of utilizing differential photo-current output from the pair of photo-detectors in the device which enables the use of differential amplifiers so that adverse electrical interference, such as, for example, common-mode interference and noise, would be mitigated as such common-mode noises will not be amplified by a differential amplifier.

Figure 7:
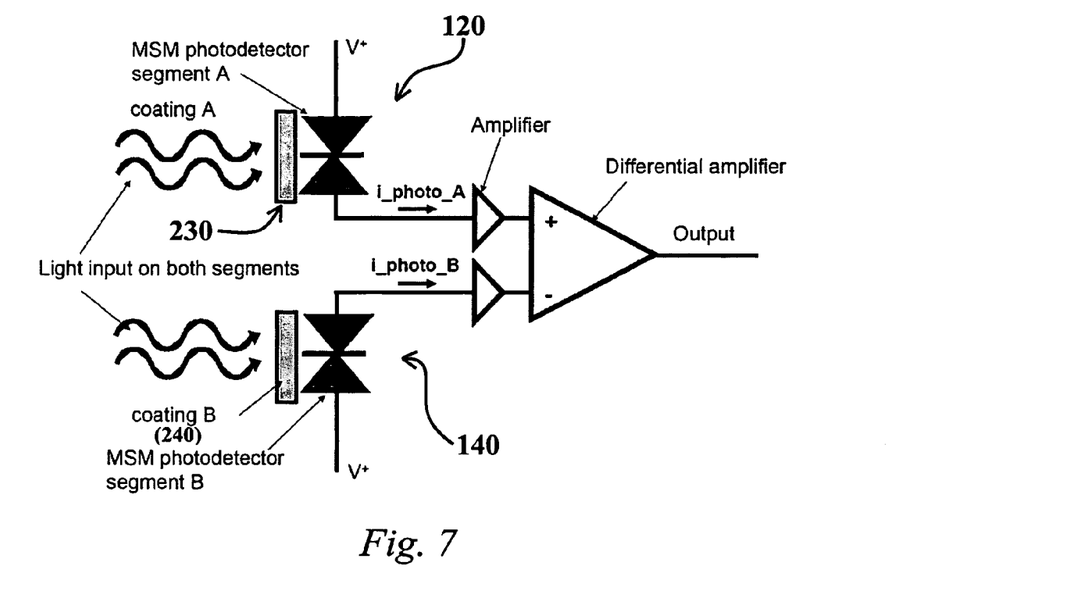
FIG. 7 is an equivalent electrical circuit diagram showing a second application of an optical-detecting device of this invention.
Figure 8:
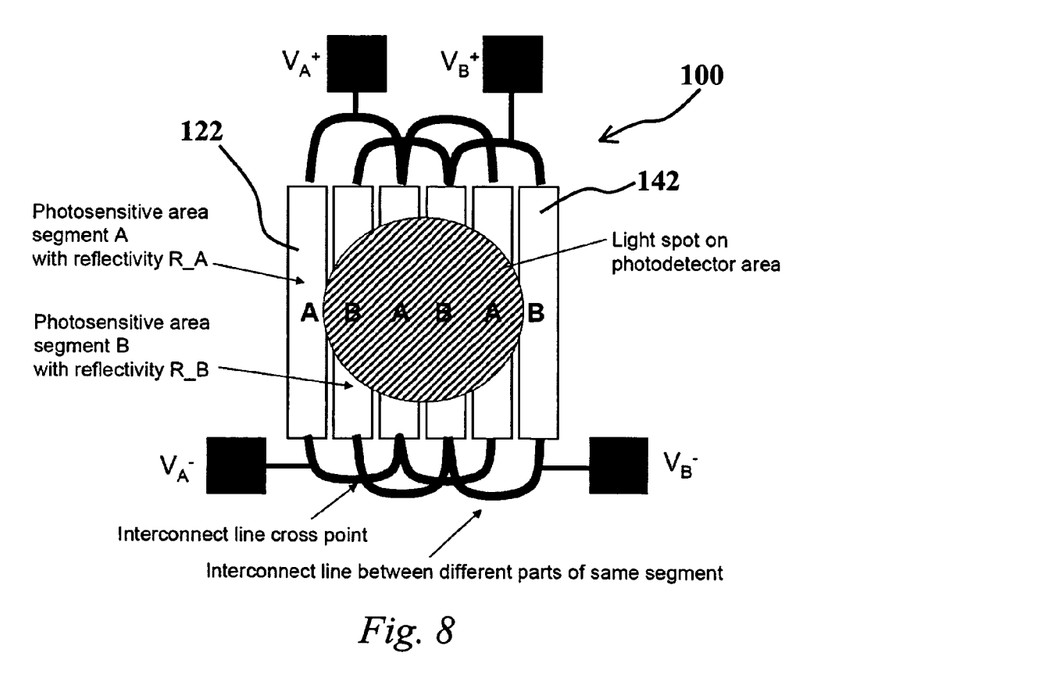
FIG. 8 is a schematic diagram illustrating the application of FIG. 7.
Figure 9:
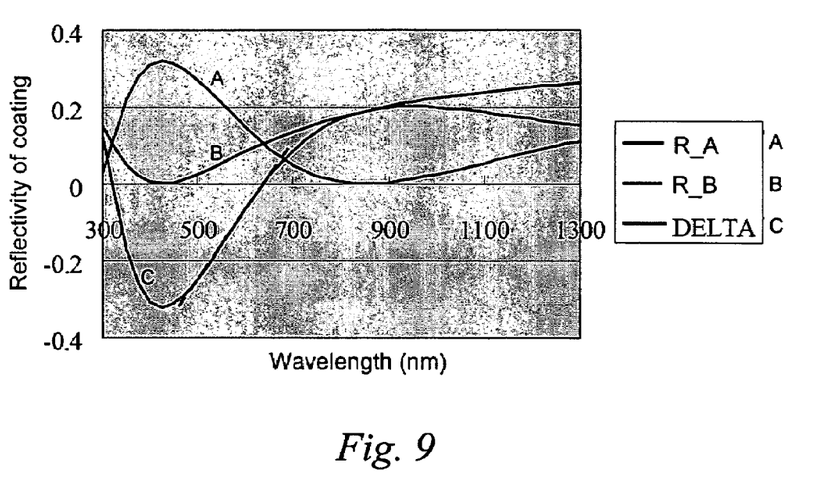
FIG. 9 shows the reflectivity of coating vs. wavelength of the optical coatings applied respectively to photo-sensitive segments A and B and their differential values.

FIGS. 7, 8 and 9 illustrate a second application of an opto-electronic device of this invention for wavelength detection, discrimination, monitoring and/or control. As shown in FIG. 7, a wavelength sensitive coating is applied between a photo-detector and the incoming light. Because of the wavelength selectivity of the wavelength sensitive coating, the photo-current output of a photo-detector is dependent on the wavelength of the incoming light and graphs showing exemplary selectivity of coatings suitable for operation between 300-700 nm and their differences are shown in FIG. 7. As can be seen in FIG. 9, the differences between the wavelength responses of the two wavelength sensitive coatings have a linear region in the 500-700 nm. By calibrating a wavelength monitoring device with reference to the exemplary linear region of FIG. 9, the wavelength of the instantaneous incoming light can be determined by reference to the linear region and feedback control can be implemented to ensure that a light of a correct wavelength is generated. For this application, the photo-detection segments A of the first photo-detector are coated with a wavelength sensitive substances of wavelength response R_A (230) and the photo-detection segments B of the second photo-detector are coated with a wavelength sensitive substance with a characteristic wavelength response R_B (240 as shown in FIGS. 7 and 9. In this application, the first and the second photo-detectors are biased with voltage of the same polarity, although differential outputs can also be utilized without loss of generality. Similarly, the distributed and interposed photo-detection segments of dimensions substantially smaller than the dimension of the light spot again facilities even detection of light by the two photo-detectors for enhanced detection resolution. Since non-differential inputs are fed to the differential amplifier in this application, the optoelectronic device can be implemented with non-MSM photo-detectors.

Figure 10:
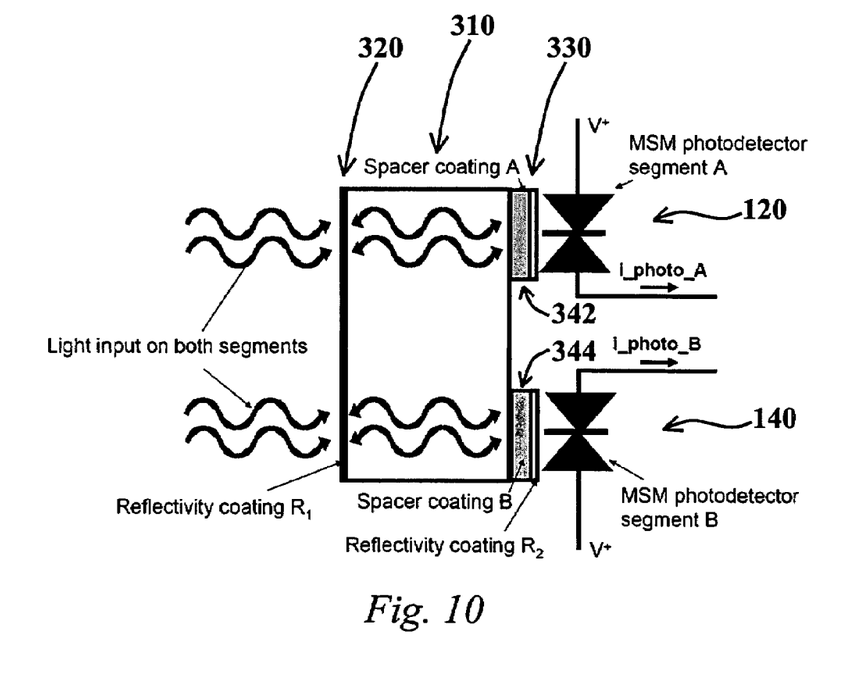
FIG. 10 illustrates a third application of the optical-detecting device of this invention.
Figure 11:
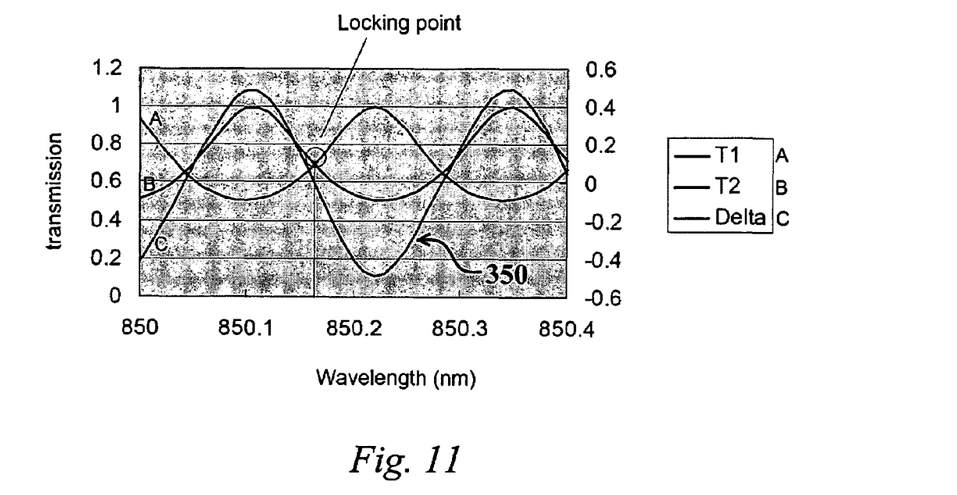
FIG. 11 shows the respective coefficients of transmission vs. wavelength of spaces A and B and their differentials of the set-up of FIG. 10.
Figure 12:
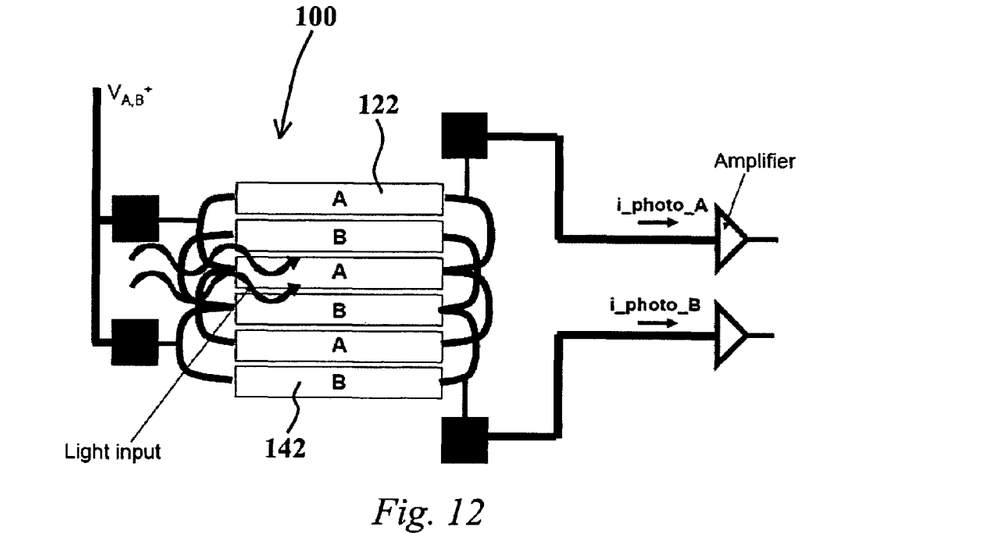
FIG. 12 illustrates an exemplary implementation of an optical-detecting device of this invention as a displacement sensor in a fourth application.
Figure 13:
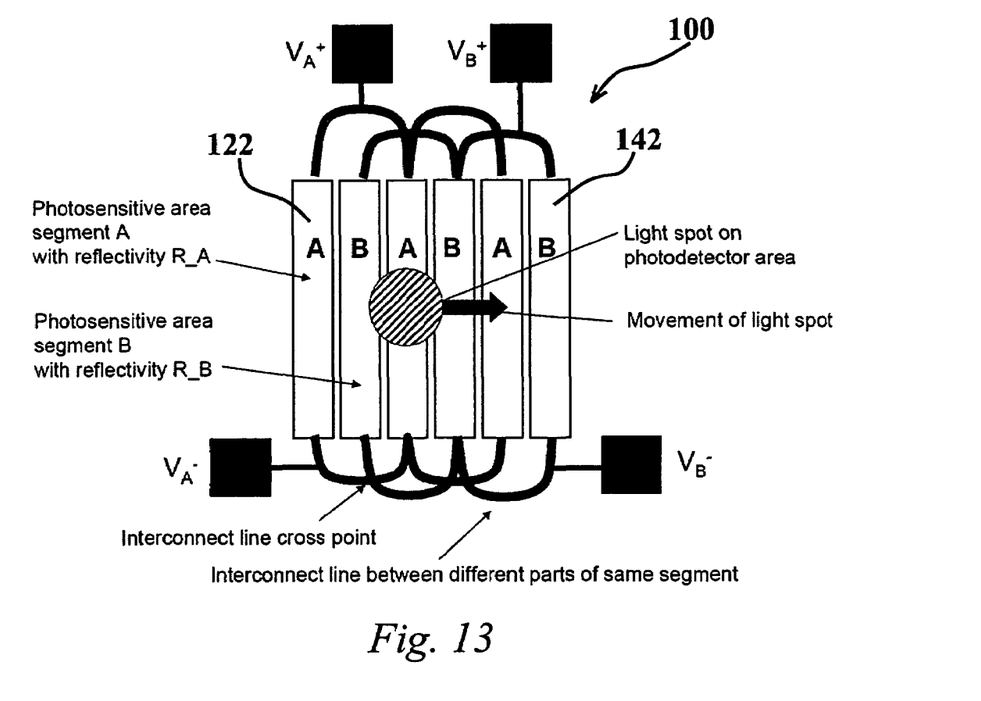
FIG. 13 illustrates the principle of application of the application of FIG. 12.

Another exemplary application of the opto-electronic device of this invention as a wavelength sensitive device which can be used for the detection, discrimination, monitoring and/or control of a light wave of a specific wavelength is illustrated in FIGS. 10 and 11.

To enhance wavelength sensitivity of the opto-electronic device, an external optical cavity is placed intermediate an incoming light source and the photo-detector (120, 140). Referring to FIG. 9, an optical resonator is formed by applying a reflective coating (320) on the outer surface of an optical cavity (310) and at the upstream end of the optical cavity which faces an approaching light beam. Another reflective surface coating (330) is applied between the downstream end of the cavity and the individual photo-detectors (120, 140). This reflective coating can be applied on the photo-detecting surface. Usually, the interface between the material of the optical cavity, such as glass, and the semi-conductor of the photo-detectors would be sufficient to achieve desired spectral response. An additional coating layer may be applied if the spectral response is not sufficient. An optical spacer layer is formed intermediate the optical cavity and the photo-detectors. The thickness of the optical spacer layer (342, 344) is different for the different photo-detectors. More specifically, the difference in the thickness of the spacer layers is adjusted to obtain an appropriate wavelength dependence of the signal from the different segments by providing a variable mode spacing between the optical paths of the two photo-detectors as shown in FIG. 11. By combining the differential characteristics of the spectral response by adjusting the mode spacing between the two optical paths, a resultant spectral response curve as shown in FIG. 11 can be obtained. By tracing the relationship between the mode spacing and the resulting difference curve (350), wavelength specific or sensitive information can be obtained from the photo-detector for useful applications without loss of generality.

Figure 14:
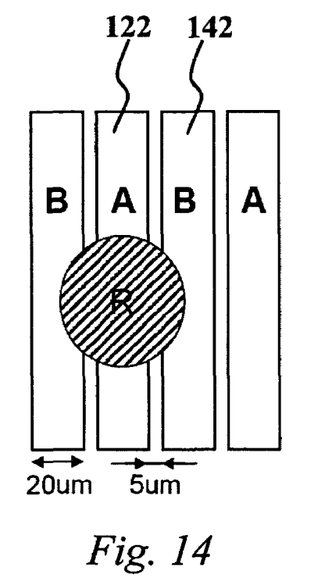
FIG. 14 shows exemplary details of the photo-sensitive segments of the device of FIG. 13 for the application of FIG. 14A.
Figure 14A:
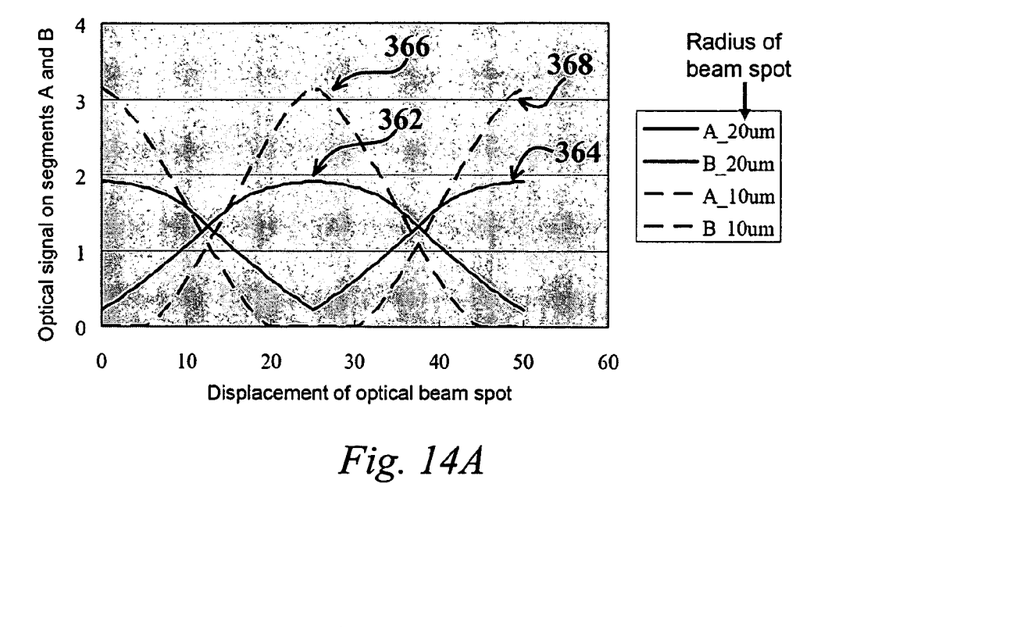
FIG. 14A shows graphs of variation of signal amplitude with respect to displacement of an optical spot with reference to two sets of width end inter-segment spacing.
Figure 15:
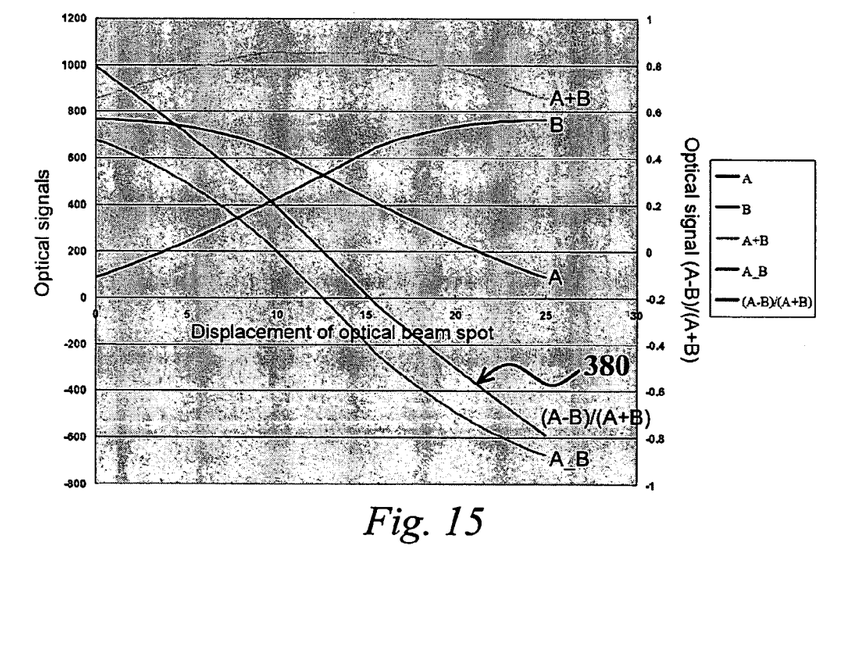
FIG. 15 shows graphs of variation of optical signal output with respect to displacement of an optical beam spot as shown in FIG. 15A.
Figure 15A:
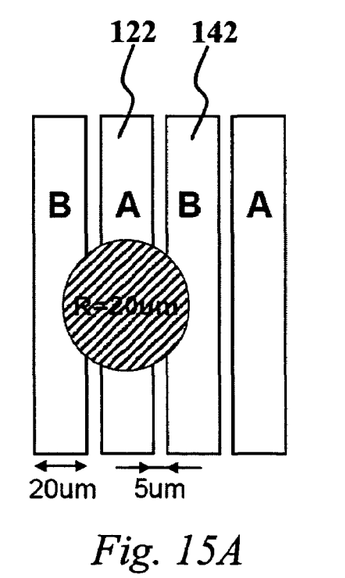
FIG. 15A illustrates the photo-sensitive segments of an optical detecting device of this invention with reference to the application of FIG. 15.

Application of a photo-detector of this invention as a displacement sensor for detecting instantaneous locality of light impingement on a photo-detector is illustrated in FIGS. 12-15A. In the schematic circuit arrangement of FIGS. 12 and 13, the photo-detectors of FIG. 2 and their respective photo-current outputs are connected to respective amplifiers. To facilitate locality discrimination of an incoming light spot, the lateral footprint of an incoming light sport is less than the total lateral width of a pair of interposed photo-detection segments. For example, as shown in FIGS. 14 and 15A, each of the photo-detection segment has a segment width of 20 µm and a segment spacing of 5 µm while the radius of an incoming light spot of a circular shape is 20 µm. When a light spot of a lateral footprint less than the total combined segment width of a pair of photo-detection segments, the variation of photo-current outputs from the photo-detectors (120, 140) will have a variation by two anti-phasing curves (362, 364) as shown in FIG. 14A. Another pair of anti-phase curve with more salient response peaks is obtained with a light spot of a significantly smaller lateral footprint of 10 µm. FIG. 15 illustrates the variation of photo-current output from photo-detection segments of the different photo-detectors as a function of optical beam movements with the diameter of the light spot being equal to 40 µm. The position of the light spot can be precisely determined by the ratio of (A−B)/(A+B) (380) which is independent of photo-current strength.

Figure 16:
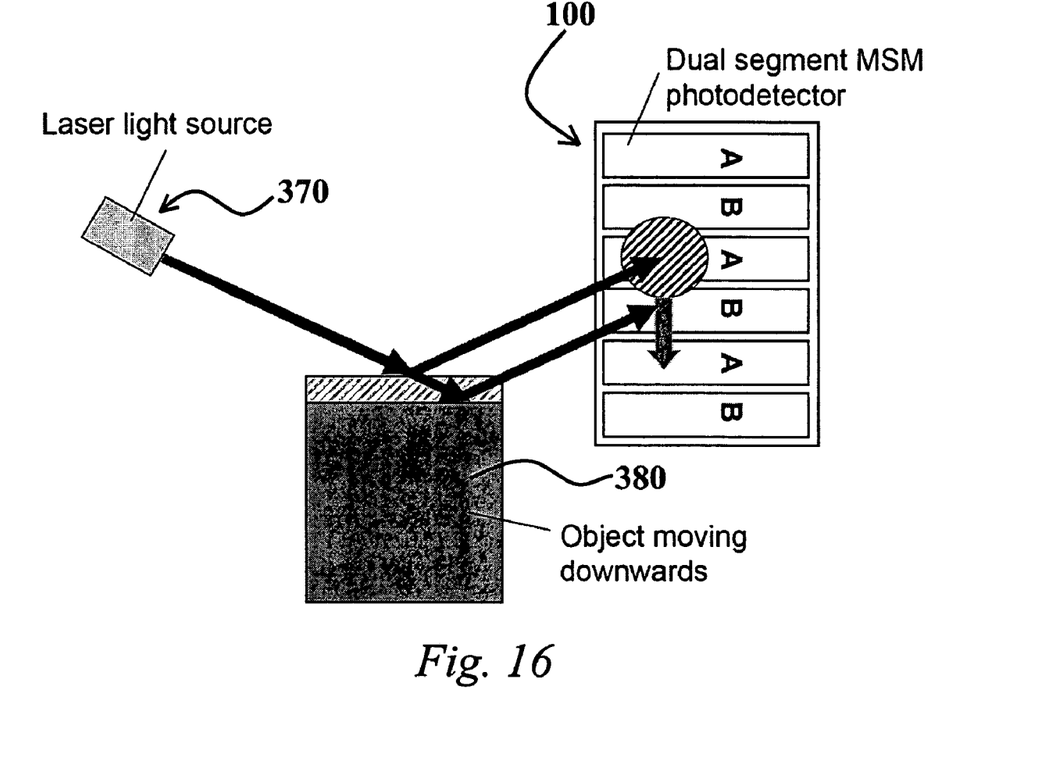
FIG. 16 shows an exemplary set-up for deflection measurements using an optical-detecting device of this invention.

An exemplary application of the displacement detection characteristic of the photo-detectors of this invention is illustrated in FIG. 16. In this arrangement, a light beam (380) from a lacer source (370) is impinged at an angle to a reflective surface of an object. When the object displaces, as shown by the arrow of FIG. 16, the light spot also moves. By tracing the movement of the light spot, for example, by the methods described above, the displacement of the object can be measured. By collecting displacement information of an object along an appropriate length, the deflection of an object as well as the individual displacements can be measured.

While the present invention has been explained with reference to the examples or preferred embodiments described above, it will be appreciated that those are examples to assist understanding of the present invention and are not meant to be restrictive. In particular, variations or modifications which are obvious or trivial to persons skilled in the art, as well as improvements made thereon, should be considered as falling within the scope of the present invention.

Furthermore, while the present invention has been explained by reference to MSM photo-detectors, it should be appreciated that the invention can apply, whether with or without modification, to other photo-detectors such as pin or other photodiodes mutatis mutandis without loss of generality.

The invention claimed is:

1. An opto-electronic device comprising a plurality of photo-detectors, each said photo-detector comprises a plurality of elongate optical detection segments which are connected in parallel, the elongate optical detection segments of said plurality of photo-detectors are interposed so that an optical detection segment of a photo-detector is intermediate optical detection segments of another photo-detector and an optical detection segment of that another photo-detector is intermediate optical detection segments of said photo-detector, wherein said elongate optical detection segments are of the same width and the spacing between an adjacent pair of interposed elongate optical detection segments is the same.

2. An opto-electronic device comprising a plurality of photo-detectors, each said photo-detector comprising a plurality of optical detection segments which are connected in parallel, the optical detection segments of said plurality of photo-detectors being interposed so that an optical detection segment of a photo-detector is intermediate optical detection segments of another photo-detector and an optical detection segment of that another photo-detector is intermediate optical detection segments of said photo-detector, wherein each said optical detection segment is elongate and comprises a plurality of interposed metal electrodes on an optical absorption layer.

3. An opto-electronic device according to claim 2, wherein said elongate optical detection segments are of the same width and the spacing between an adjacent pair of interposed elongated optical detection segments is the same.

4. An opto-electronic device comprising a plurality of elongate photo-detectors, each said photo-detector comprising a plurality of elongate optical detection segments which are connected in parallel, the elongate optical detection segments of said plurality of photo-detectors being interposed so that an optical detection segment of a photo-detector is intermediate optical detection segments of another photo-detector and an optical detection segment of that another photo-detector is intermediate optical detection segments of said photo-detector, wherein said optical detection segments are of the same dimensions and the spacing between an adjacent pair of interposed elongated optical detection segments is the same.

5. An opto-electronic device comprising a plurality of photo-detectors, each said photo-detector comprising a plurality of elongate optical detection segments which are connected in parallel, the elongate optical detection segments of said plurality of photo-detectors being interposed so that an optical detection segment of a photo-detector is intermediate optical detection segments of another photo-detector and an optical detection segment of that another photo-detector is intermediate optical detection segments of said photo-detector, wherein said optical detection segments comprise rectangular portions of the same width, the long sides of said optical segments are parallel and the spacing between an adjacent pair of interposed optical detection segments is the same.

6. An opto-electronic device according to claim 1, wherein the length to width ratio of said elongated photo-detection segments exceeds 10.

7. An opto-electronic device according to claim 1, wherein the length to width ratio of said elongated photo-detection segments exceeds 100.

8. An opto-electronic device according to claim 1, wherein said plurality of photo-detectors are formed on a single substrate.

9. An opto-electronic device according to claim 1, wherein each of said plurality of photo-detectors has individual output terminals.

10. An opto-electronic device according to claim 1, wherein said photo-detector comprises a photo-diode.

11. An opto-electronic device according to claim 2, wherein said photo-detector comprises a MSM photo-detector.

12. An opto-electronic device according to claim 11, further comprising differential circuitry in differential connection with signal outputs of said plurality of photo-detectors.

13. An opto-electronic device according to claim 11, wherein the optical-detection segments of at least a photo-detector have a wave-length sensitive coating.

14. An opto-electronic device according to claim 11, wherein the elongate optical-detection segments of a photo-detector are coated with a wavelength sensitive coating, the wavelength sensitive coatings on said photo-detectors are different and are arranged whereby a linear region of reflectivity against wavelength is produced.

15. An opto-electronic device according to claim 11, wherein the elongate optical-detection segments of a photo-detector have a wavelength sensitive coating and the wavelength sensitivity of the coating on said plurality of photo-detectors is different.

16. An opto-electronic device according to claim 15, further comprising wave-length sensing circuitry, the wave-length sensing circuitry comprises signal processing means to process differential signal outputs from said plurality of photo-detectors for determining the wave-length of an incoming optical signal.

17. An optical detection device comprising an opto-electronic device of claim 11, wherein said plurality of photo-detectors are arranged with differential outputs, the differential outputs are differentially amplified.

18. An optical detection device comprising an opto-electronic device of claim 1, wherein said plurality of photo-detectors are coated with wavelength sensitive substances and the wavelength sensitivity is different for said plurality of photo-detectors, difference of outputs from said plurality of photo-detectors are processed for wavelength identification.

* * * * *